(12) United States Patent
Edmond et al.

(10) Patent No.: US 9,362,455 B2
(45) Date of Patent: Jun. 7, 2016

(54) SEMICONDUCTOR LIGHT EMITTING DIODES HAVING MULTIPLE BOND PADS AND CURRENT SPREADING STRUCTURES

(75) Inventors: John Adam Edmond, Durham, NC (US); Matthew Donofrlo, Raleigh, NC (US); Shawn Pyles, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 161 days.

(21) Appl. No.: 13/034,267

(22) Filed: Feb. 24, 2011

(65) Prior Publication Data

US 2012/0217530 A1    Aug. 30, 2012

(51) Int. Cl.
| | |
|---|---|
| H01L 33/36 | (2010.01) |
| H01L 33/62 | (2010.01) |
| H01L 33/38 | (2010.01) |
| H01L 33/08 | (2010.01) |
| H01L 33/40 | (2010.01) |
| H01L 33/50 | (2010.01) |
| H01L 33/58 | (2010.01) |

(52) U.S. Cl.
CPC .............. *H01L 33/38* (2013.01); *H01L 33/62* (2013.01); *H01L 33/08* (2013.01); *H01L 33/405* (2013.01); *H01L 33/505* (2013.01); *H01L 33/58* (2013.01)

(58) Field of Classification Search
CPC combination set(s) only.
See application file for complete search history.

(56) References Cited

U.S. PATENT DOCUMENTS

| | | | | |
|---|---|---|---|---|
| 3,900,864 | A * | 8/1975 | Dapkus et al. | 257/87 |
| 5,300,788 | A * | 4/1994 | Fan et al. | 257/13 |
| 6,335,548 | B1 * | 1/2002 | Roberts et al. | 257/98 |
| 7,638,813 | B2 * | 12/2009 | Kinsman | 257/99 |
| 2003/0020084 | A1* | 1/2003 | Fan et al. | 257/92 |
| 2006/0186418 | A1* | 8/2006 | Edmond et al. | 257/79 |
| 2008/0085122 | A1* | 4/2008 | De Pauw | 398/139 |
| 2008/0217635 | A1* | 9/2008 | Emerson et al. | 257/98 |
| 2009/0050924 | A1* | 2/2009 | Edmond | 257/99 |
| 2010/0207157 | A1* | 8/2010 | Schiaffino et al. | 257/99 |
| 2011/0241031 | A1* | 10/2011 | von Malm et al. | 257/88 |
| 2012/0086024 | A1* | 4/2012 | Andrews et al. | 257/88 |

FOREIGN PATENT DOCUMENTS

WO    WO-2010-072191 A1 *    7/2010    ............. H01L 27/15

* cited by examiner

*Primary Examiner* — Johannes P Mondt
(74) *Attorney, Agent, or Firm* — Myers Bigel & Sibley, PA

(57) ABSTRACT

A light emitting device includes a diode region comprising a first face and opposing edges, and a bond pad structure comprising at least three bond pads along only one of the opposing edges of the first face.

22 Claims, 7 Drawing Sheets

SEMICONDUCTOR LIGHT EMITTING DIODES HAVING MULTIPLE BOND PADS AND CURRENT SPREADING STRUCTURES

BACKGROUND

This invention relates to semiconductor light emitting devices and methods of fabricating same, and more particularly to semiconductor Light Emitting Diodes (LEDs) and fabrication methods therefor.

Semiconductor LEDs are widely known solid-state lighting elements that are capable of generating light upon application of voltage thereto. LEDs generally include a diode region having first and second opposing faces, and including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with one ultimate goal being a replacement for the ubiquitous incandescent lightbulb.

SUMMARY

In some embodiments, a light emitting device includes a diode region comprising a first face and opposing edges, and a bond pad structure comprising at least three bond pads along only one of the opposing edges of the first face.

In some embodiments, the bond pad structure comprises conductive fingers extending from the at least three bond pads. The bond pad structure may include a plurality of bond pad unit cells arranged in a row along the first face of the diode region, and each bond pad unit cell may include a bond pad and a plurality of current spreading fingers. In some embodiments, the plurality of bond pad unit cells include a same pattern of current spreading fingers.

In some embodiments, at least one of the plurality of bond pad unit cells may include a pattern of current spreading fingers that represents information. The pattern of current spreading fingers that represents information may be arranged to form alphanumeric characters. The pattern of current spreading fingers may be arranged to form alphanumeric characters that communicate information relating to an operating property of the light emitting diode. The pattern of current spreading fingers may be arranged to form alphanumeric characters that communicate information relating to the color temperature, wavelength, and/or numinous intensity of light emitted by the light emitting diode.

In some embodiments, each of the bond pads is configured to receive a wire bond structure.

In some embodiments, the diode region comprises a second face opposite the first face, and the opposing edges comprise first and second opposing edges running along a width of the first face of the diode region. The first face further comprises third and fourth opposing edges running along a length of the first face of the diode region. The at least three bond pads are spaced apart along the first face from the third edge to the fourth edge of the first face and offset towards the first edge of the first face of the diode regions. The bond pad structure further comprises a plurality of current spreading fingers extending from the at least three bond pads onto the diode region.

In some embodiments, a ratio of the width of the first face to the length of the first face is greater than one.

In some embodiments, the current spreading bond pad structure comprises at least five bond pads spaced apart along the first face from the third edge to the fourth edge of the first face.

In some embodiments, the current spreading bond pad structure comprises at least eight bond pads spaced apart along the first face from the third edge to the fourth edge of the first face.

In some embodiments, the current spreading fingers are curved.

In some embodiments, a light emitting device includes a semiconductor region comprising a first face, and a contact pattern arranged on the first face to convey information.

In some embodiments, the contact pattern comprises at least one bond pad and a plurality of current spreading fingers extending from the at least one bond pad and arranged to form alphanumeric characters that communicate information.

In some embodiments, the contact pattern is arranged to form alphanumeric characters that communicate information relating to an operating property of the light emitting diode. The contact pattern may be arranged to form alphanumeric characters that communicate information relating to the color temperature, wavelength, and/or luminous intensity of light emitted by the light emitting diode.

In some embodiments, the contact pattern comprises at least one bond pad and a plurality of current spreading fingers extending from the at least one bond pad and arrange to form a symbol.

In some embodiments, the current spreading fingers are curved.

In some embodiments, a light emitting device includes a diode region comprising a first face and opposing edges, and a bond pad structure comprising at least four bond pads along only one of the opposing edges of the first face.

DETAILED DESCRIPTION

Figure 1A:
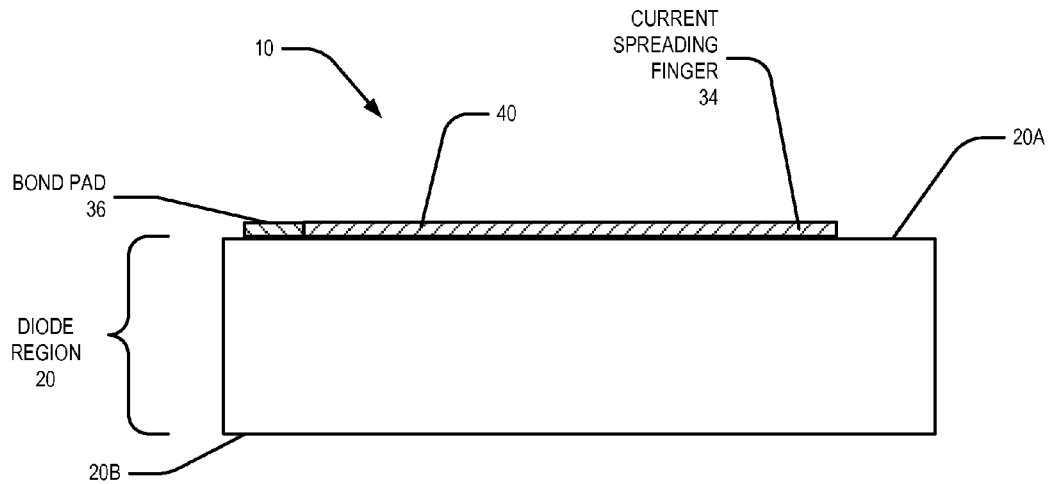
FIG. 1A is a cross-sectional view of a light emitting device according to some embodiments.

Embodiments of the invention provide light emitting devices including current spreading bond pad structures. The current spreading bond pad structures may be based on current spreading bond pad unit cell structures that can be repeated across a face of a diode region of the light emitting device. Accordingly, current spreading bond pad structures according to some embodiments may be particularly suitable for high aspect ratio light emitting devices that may benefit from extended contact structures. The use of current spreading bond pad unit cells as building blocks to form current spreading bond pad structures may provide a convenient, cost effective and/or scalable mechanism for providing bond pad structures for light emitting devices having various dimensions.

Embodiments of the present invention are described more fully herein with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region of an LED is considered to be "transparent" when at least 90% of the radiation from the LED that impinges on the transparent layer or region emerges through the transparent region. For example, in the context of blue and/or green LEDs that are fabricated from gallium nitride-based materials, silicon dioxide can provide a transparent insulating layer (for example, at least 90% transparent), whereas indium tin oxide (ITO) can provide a transparent conductive layer (for example, at least 90% transparent) as measured by considering transmitted and reflected components on a sapphire substrate. Moreover, as used herein, a layer or region of an LED is considered to be "reflective" when at least 90% of the angle averaged radiation that impinges on the reflective layer or region from the LED is reflected back into the LED. For example, in the context of gallium nitride-based blue and/or green LEDs, aluminum (for example, at least 90% reflective) may be considered reflective materials. In the case of ultraviolet (UV) LEDs, appropriate materials may be selected to provide a desired, and in some embodiments high, reflectivity and/or a desired, and in some embodiments low, absorption.

Some embodiments now will be described generally with reference to gallium nitride (GaN)-based light emitting diodes on silicon carbide (SiC)-based mounting substrates for ease of understanding the description herein. However, it will be understood by those having skill in the art that other embodiments of the present invention may be based on a variety of different combinations of mounting substrate and epitaxial layers. For example, combinations can include AlGaInP diodes on GaP mounting substrates; InGaAs diodes on GaAs mounting substrates; AlGaAs diodes on GaAs mounting substrates; SiC diodes on SiC or sapphire ($Al_2O_3$) mounting substrates and/or a Group III-nitride-based diode on gallium nitride, silicon carbide, aluminum nitride, sapphire, zinc oxide and/or other mounting substrates. Moreover, in other embodiments, a mounting substrate may not be present in the finished product. In some embodiments, the light emitting diodes may be gallium nitride-based LED devices manufactured and sold by Cree, Inc. of Durham, N.C.

FIG. 1A is a cross-sectional view of a light emitting diode 10 according to various embodiments. As shown in FIG. 1A the diode 10 includes a diode region 20 having first and second opposing faces 20A, 20B, respectively. The diode region 20 may also be referred to herein as an "LED epi region," because it is typically formed as epitaxial layers on a growth substrate (not shown). For example, a Group III-nitride based LED epi region may be formed on a silicon carbide, sapphire, silicon or Group III-nitride based growth substrate. In some embodiments, as will be described below, a growth substrate may be present in the finished product. In other embodiments, the growth substrate may be removed. A current spreading bond pad structure 40 is formed on the diode region 20. The current spreading bond pad structure 40 includes a metal bond pad 36 on the diode region 20 and one or more metal current spreading fingers 34 that extend from the bond pad 36 across the diode region 20.

In some embodiments, the metal bond pad 36 and the metal current spreading fingers 34 of the bond pad structure 40 may be formed of the same material and may be deposited in one or more layers using a mask and other deposition processes known to those of skill in the art. The metal bond pad 36 may be the same height as the current spreading fingers 34. However, it should be understood that in some embodiments, the metal bond pad 36 and current spreading fingers 34 may be formed of different materials and/or be formed of different sizes and/or heights. The metal bond pad 36 may be sized and configured to receive a metal contact, such as a wire metal bond. The metal bond pad structure 40 may be formed of any suitable conductive material, such as aluminum, to form an ohmic contact on the diod region 20. For example, an aluminum layer may be used, such as Al/Ti/Au/Ti/Au at layer thicknesses of 1000 Å/1000 Å/1000 Å/500 Å/3μ, respectively. In some embodiments, the metal bond pad structure 40 may include one or more transparent layers, such as indium tin oxide (ITO). Accordingly, metal layer(s), including aluminum, titanium, gold and/or indium tin oxide, may be used to form the metal bond pad structure, e.g., to form ohmic contacts with a portion of the diode region 20. Such metal layers may be suitable to form n-GaN ohmic contacts via the metal bond pad structure 40. However, it should be understood that any suitable diode and/or semiconductor structure may be used for the diode region 20 and the metal bond pad structure 40 may be used to form an ohmic contact with a p-layer and/or an n-layer of the diode structure 20. In some embodiments, the metal bond pad structure 40 may form an anode ohmic contact and may be directly on a p-layer, such as p-GaN. In some embodiments, an anode ohmic contact metal bond pad structure may be a reflective anode contact, which may a two-layer structure including, for example, about 5 Å of nickel (Ni) directly on the p-type layer and about 1000 Å of silver (Ag) on the nickel, to thereby provide an "NiAg mirror." The NiAg mirror can reflect at least 90% of the visible light from the diode region that impinges thereon. Other reflective layers that also provide an ohmic contact to p-type gallium nitride may be used in other embodiments. It will be understood that the reflectivity of the NiAg mirror is determined primarily by the Ag because only a very thin layer (in some embodiments less than about 10 Å) of Ni is used. Moreover, when annealed, this nickel may convert to nickel oxide to enhance the ohmic contact for the Ag to the p-type gallium nitride. Thus, the NiAg mirror can have about the same reflectivity of Ag alone, but can provide a better contact and lower voltage to the p-type layer. In other embodiments, pure Ag may be used. Although the metal bond pad structure 40 is illustrated on a planar surface, it should be understood that a roughened surface, such as a crystallographic textured surface may be used and may provide improved physical and electrical connection between the metal bond pad structure 40 and an active portion of the diode region 20. Such structures are described in U.S. Pat. No. 7,791,061, the disclosure of which is incorporated by reference in its entirety.

An optional passivation layer (typically formed of silicon dioxide, stoichiometric silicon nitride, nonstoichiometric silicon nitride or combinations thereof) may cover the diode region 20 to provide both electrical isolation and environmental protection (not shown). Exemplary ohmic contacts and passivation layers are described in U.S. Pat. No. 7,791,061, the disclosure of which is incorporated by reference herein.

Figure 1B:
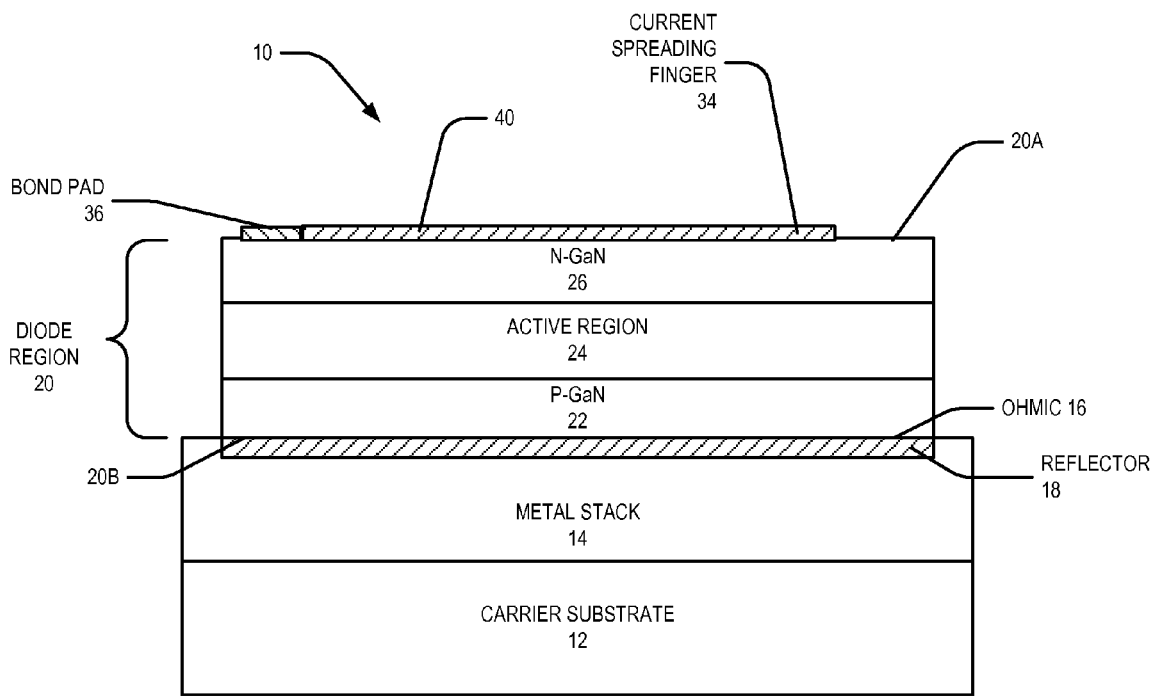
FIG. 1B is a cross-sectional view of a light emitting device according to some embodiments.

As illustrated in FIG. 1B, the metal bond pad structure 40 may form a direct ohmic contact to n-GaN; however, as discussed above, it should be understood that the metal bond pad structure 40 may be on a p-layer of the diode region 20.

Referring to FIG. 1B, the light emitting diode 10 includes a diode region 20 having first and second opposing faces 20A, 20B, respectively, and including therein an n-type layer 26, a p-type layer 22, and an active region 24 between the n-type layer 26 and the p-type layer 22. The active layer 24 may include a single or multiple quantum well structure, a single heterostructure, a double heterostructure or other light emitting structure. Other layers or regions may be provided in the diode region 20, such as superlattice structures, buffer layers, distributed Bragg reflectors, etc., that need not be described herein.

Continuing with the description of FIG. 1B, an anode ohmic contact 16 is formed on the p-type layer 22 on the second face 20B of the diode region. The anode ohmic contact 16, which may also be referred to as a "p-contact", ohmically contacts the p-type layer 22 and extends on the second face 20B of the diode region 20. The anode ohmic contact 16 may extend to a greater or less extent on the p-type layer 22 than illustrated in FIG. 1B. The anode ohmic contact 16 may include a very thin layer, for example 3 nm, or platinum. In some embodiments, the anode ohmic contact may include reflective anode contact 18, which may a two-layer structure including, for example, about 5 Å of nickel (Ni) directly on the p-type layer 22 and about 1000 Å of silver (Ag) on the nickel, to thereby provide an "NiAg mirror." Other reflective layers that also provide an ohmic contact to p-type gallium nitride may be used in other embodiments, including pure Ag.

The diode region 20 is attached to a carrier substrate 12 by means of a metal stack 14. The metal stack 14 may include adhesion, bonding and barrier layers as described, for example, in commonly assigned U.S. Patent Application Publication No. 2007/0161137, the disclosure of which is incorporated herein by reference.

The carrier substrate 12 may include a material, such as silicon, alumina, aluminum nitride, etc., that may provide mechanical stability and/or low thermal resistance.

The current spreading finger 34 on the diode region 20 may have reduced light absorbing compared to other current spreading layers. The potentially negative impact of the current spreading layer (due to light absorption) may also be reduced by reducing the light hitting the metal current spreading layer by "killing" the portion of the diode region under the current spreading finger 34 so that the light hitting that area mostly comes from an angle that is outside the region directly under the current spreading finger 34. "Killing" the diode region means causing a portion of the diode region to not generate light, such as by reducing the conductivity of the n-type layer, the p-type layer and/or the active region. Thus, some embodiments can also incorporate a reduced conductivity region in a p-type layer or n-type layer that are congruent with nearby more opaque features, such as the current spreading fingers, as described in commonly assigned U.S. Patent Application Publication No. 2008/0217635 and U.S. Pat. No. 7,795,623, the disclosures of which are hereby incorporated by reference in their entirety as if set forth fully herein.

Some embodiments may use transparent silicon carbide (index of refraction of about 2.6) to extract light from the GaN-based diode region (index of refraction of about 2.5). Moreover, some embodiments may use ITO (index of refraction of about 1.9) and silicon dioxide (index of refraction of about 1.5) to couple between the GaN (index of refraction of about 2.5) and the reflective layer (such as aluminum). Accordingly, robust electrical, thermal and optical properties may be provided.

Although some embodiments are described herein with respect to a bond pad structure 40 that is in direct ohmic contact with the diode region 20 (e.g., the n-GaN (as shown in FIG. 1B) or the p-GaN layer), it should be understood that intervening ohmic contact layers may be used between the bond pad structure 40 and the diode region 20. Moreover, other diode/semiconductor structures known to those of skill in the art may be used. For example, as shown in FIG. 1C, a cathode ohmic contact 32 is formed on the n-type layer 26.

The cathode ohmic contact 32 may include aluminum (Al) (e.g., Al/Ti/Au/Ti/Au); however, in some embodiments, the cathode ohmic contact 32 may be a transparent cathode ohmic contact and may include indium tin oxide (ITO).

Figure 1C:
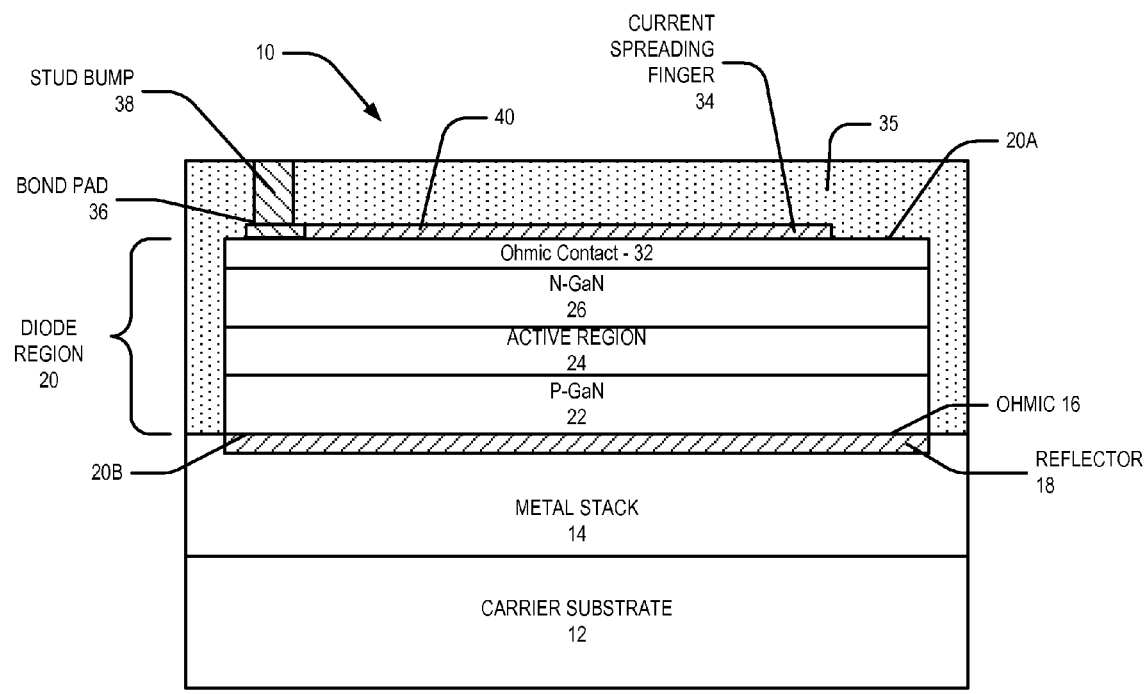
FIG. 1C is a cross-sectional view of a light emitting device according to some embodiments.

As shown in FIG. 1C, a current spreading bond pad structure 40 is formed on the cathode ohmic contact 32 of the diode region 20. The current spreading bond pad structure 40 includes a metal bond pad 36 on the diode region 20 and one or more metal current spreading fingers 34 that extend from the bond pad 36 across the diode region 20.

In some embodiments, an insulating layer 35 covers the diode structure 20 and the current spreading bond pad structure 40. The layer 35 may include phosphor materials for wavelength conversion properties, such as a yellow, red or green phosphor materials or a combination thereof. For example, white light may be produced by surrounding a single-color LED with a luminescent material that converts some of the light emitted by the LED to light of other colors. The combination of the light emitted by the single-color LED that passes through the luminescent material along with the light of different colors that is emitted by the luminescent material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_3Al_5O_{12}$:Ce, and is commonly referred to as YAG:Ce), that "down-converts" the wavelength of some of the blue light emitted by the LED, changing its color to yellow. Blue LEDs made from indium gallium nitride exhibit high efficiency (e.g., external quantum efficiency as high as 60%). In a blue LED/yellow phosphor lamp, the blue LED chip produces an emission with a dominant wavelength of about 450-460 nanometers, and the phosphor produces yellow fluorescence with a peak wavelength of about 550 nanometers in response to the blue emission. Some of the blue light passes through the phosphor (and/or between the phosphor particles) without being down-converted, while a substantial portion of the light is absorbed by the phosphor, which becomes excited and emits yellow light (i.e., the blue light is down-converted to yellow light). The combination of blue light and yellow light may appear white to an observer. Such light is typically perceived as being cool white in color. In another approach, light from a violet or ultraviolet emitting LED may be converted to white light by surrounding the LED with multicolor phosphors or dyes. In either case, red-emitting phosphor particles (e.g., a CaAlSiN3 ("CASN") based phosphor) may also be added to improve the color rendering properties of the light, i.e., to make the light appear more "warm," particularly when the single color LED emits blue or ultraviolet light. Phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

An optional conductive stud bump 38 extends through the insulating layer 35 to facilitate electrical contact to the bond pad 36.

Figure 2:
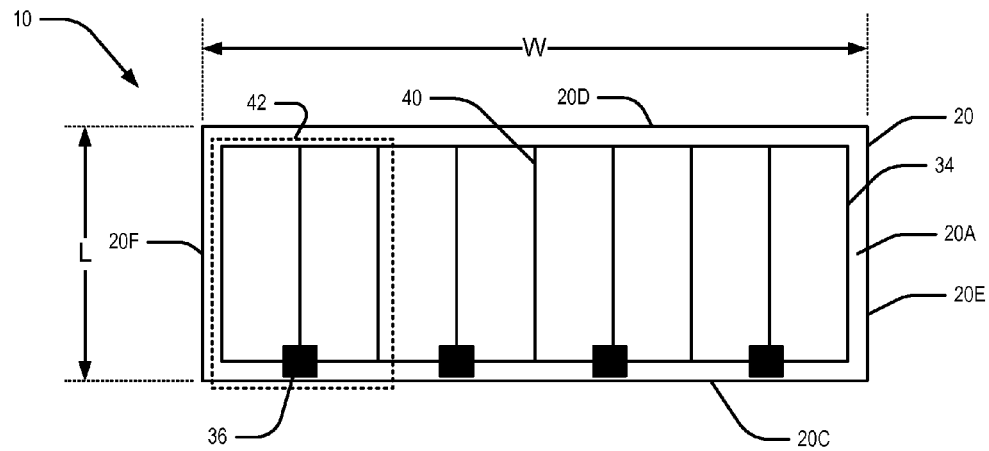
FIG. 2 is a top view of a light emitting device according to some embodiments.
Figure 3A:
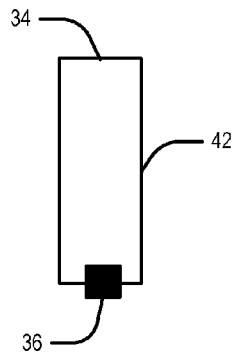
FIGS. 3A to 3D are top views of current spreading bond pad structures for light emitting devices according to some embodiments.
Figure 3B:
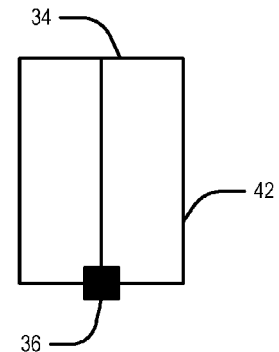
Figure 3C:
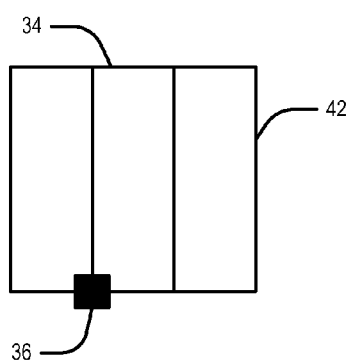
Figure 3D:
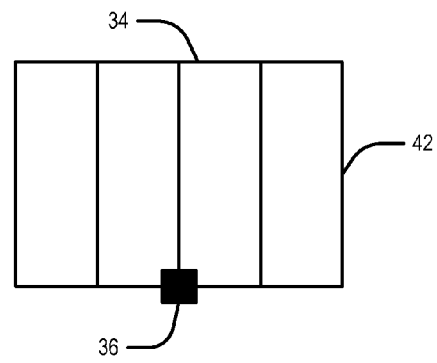

FIG. 2 is a top view of a diode portion 20 of a light emitting device according to some embodiments. As shown therein, the diode region has first and second opposing edges 20C, 20D running along the width of the first face 20A of the diode region 20 and third and fourth opposing edges 20E, 20F running along the length of the first face 20A of the diode region 20. A current spreading bond pad structure 40 is on the diode region 20. The current spreading bond pad structure 40 may include at least three bond pads 36 spaced apart along the first face 20A of the diode region from the third edge 20E to the fourth edge 20F of the first face 20A and offset towards the first edge 20C of the first face 20A of the diode region 20. A plurality of current spreading fingers 34 extend from the bond pads 36 onto the diode region 20.

The diode portion 20 may have a width W and a length L as shown in FIG. 2. The width of the diode portion 20 may be greater than the length of the diode portion 20. Thus, the diode portion 20 may have an aspect ratio (defined as the width of the diode region divided by the length of the diode region) that is greater than one, and in some cases much greater than one. For example, the aspect ratio may be between 3 and 10. The width W may be between 500 μm and 1 mm, and the length L may be between 1.5 mm and 10 mm. The die area may be greater than 1 mm$^2$ or greater than 3 mm$^2$. Such high aspect ratio light emitting diodes may be used in various different applications where a rectangular beam shape may be desired. A single, large area, high aspect ratio chip may provide higher efficiency and improved optical performance as compared to a linear array of individual chips or components. Providing current spreading bond pad structures on high aspect ratio light emitting diodes may be challenging, particularly when the aspect ratio of a chip is changed for a particular application. High aspect ratio light emitting diode chips may also be difficult to package, due to their unusual length. However, positioning the bond pads 36 along one edge of the diode region 20 (e.g., offset towards the first edge 20B) may increase the ease with which metal contacts are connected to the bond pads 36.

The current spreading bond pad structure 40 may include a repeated pattern of current spreading bond pad unit cells 42 arranged in a row along the first face 20A of the diode region 20. Each of the current spreading bond pad unit cells 42 may include a cell bond pad 36 and a plurality of cell current spreading fingers 34. The current spreading fingers 34 may interconnect with one another to form current spreading loops.

FIGS. 3A to 3D are top views of current spreading bond pad unit cell structures for light emitting devices according to some embodiments. For example, a current spreading bond pad unit cell structure 42 may include a cell bond pad 36 and a plurality of cell current spreading fingers 34 that form one, two, three or four current spreading loops.

Each of the current spreading bond pad unit cells 42 on a diode region 20 may have the same structure in some embodiments. In other embodiments, however, at least some of the current spreading bond pad unit cells have different structures. Moreover, adjacent ones of the current spreading bond pad unit cells 42 on a diode region 20 may be connected to one another or may be separated from one another.

Figure 4A:
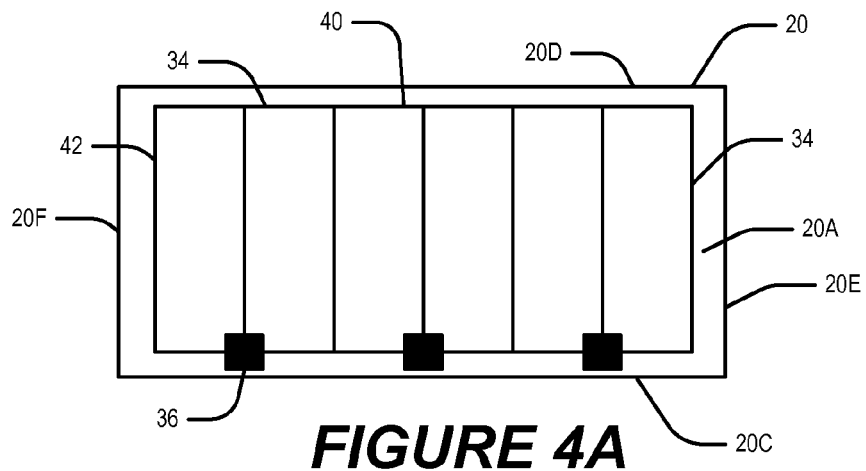
FIGS. 4A to 4C are top views of light emitting device diode regions according to various embodiments.
Figure 4B:
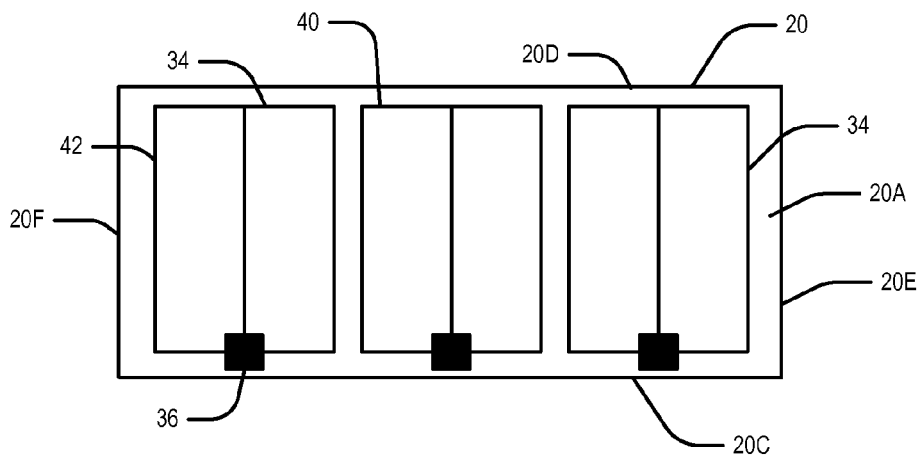
Figure 4C:
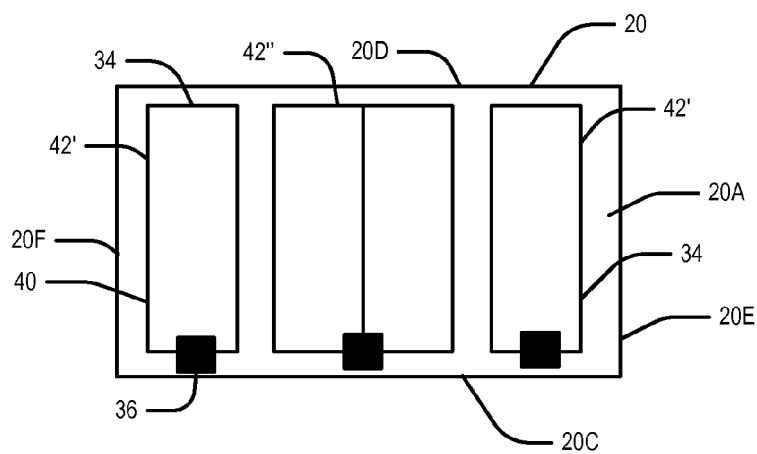

For example, FIGS. 4A to 4C are top views of light emitting device diode regions according to various embodiments. In the embodiments of FIG. 4A, the current spreading bond pad structure 40 includes three current spreading bond pad unit cells 42 each including a cell bond pad 36 and a plurality of cell current spreading fingers 34 that form two current spreading loops. The current spreading bond pad unit cells 42 are connected to one another. The cell bond pads 36 are arranged in a row between the third and fourth edges 20E, 20F of the diode region 20 and are offset towards the first edge 20B of the diode region 20.

In the embodiments of FIG. 4B, the current spreading bond pad unit cells 42 are separated from one another.

In the embodiments of FIG. 4C, two different spreading bond pad unit cells 42' and 42" are arranged alternately on the first face 20A of the diode region.

Figure 5A:
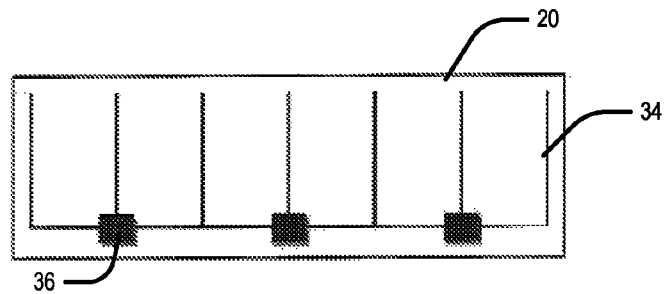
FIGS. 5A and 5B are top views of light emitting device diode regions according to various embodiments.
Figure 5B:
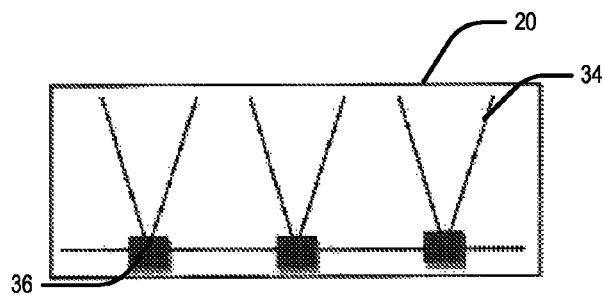
Figure 6A:
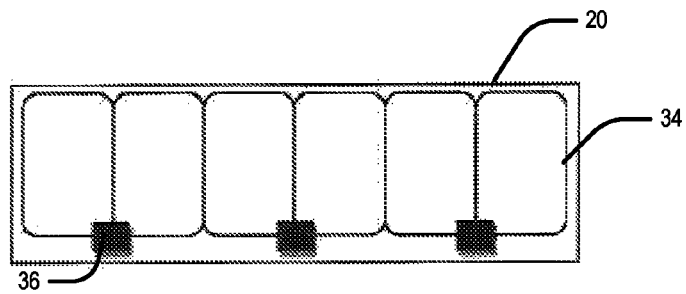
FIGS. 6A to 6D are top views of light emitting device diode regions according to various embodiments.
Figure 6B:
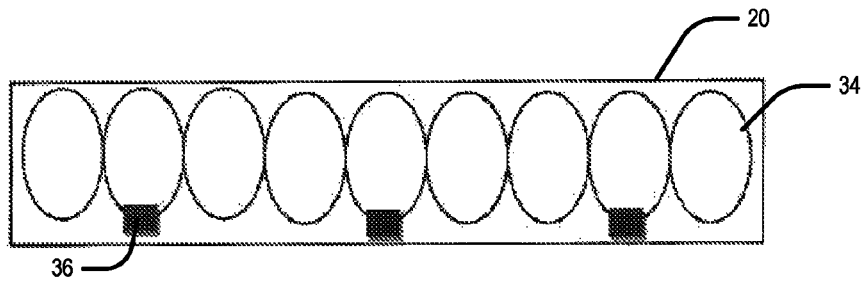
Figure 6C:
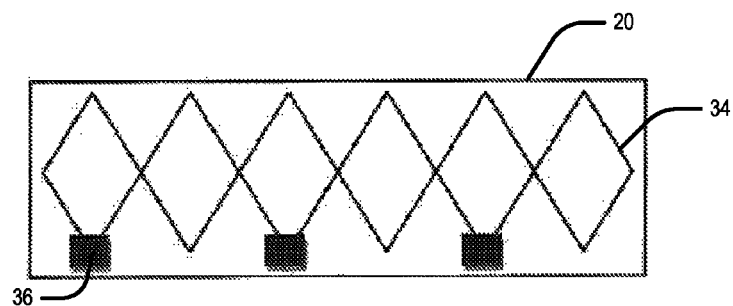
Figure 6D:
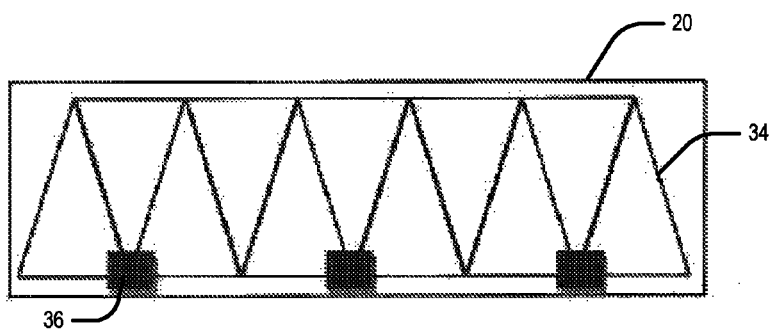

FIGS. 5A and 5B are top views of light emitting device diode regions according to various embodiments. In the embodiments of FIGS. 5A and 5B, the current spreading fingers do not form current spreading loops. Moreover, as shown in FIGS. 5A and 5B, the current spreading fingers 34 may be arranged to be parallel to edges of the diode region 20 and/or oblique to edges of the diode region 20.

FIGS. 6A to 6D are top views of light emitting device diode regions according to various embodiments. As shown therein, the current spreading fingers may be curved and/or form current spreading loops having rounded corners.

Figure 7A:
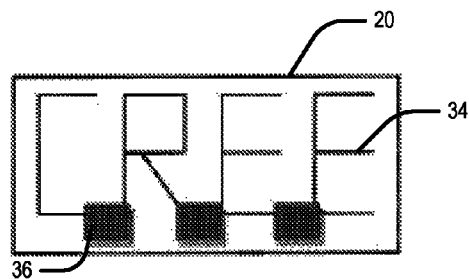
FIGS. 7A and 7B are top views of light emitting device diode regions according to various embodiments.
Figure 7B:
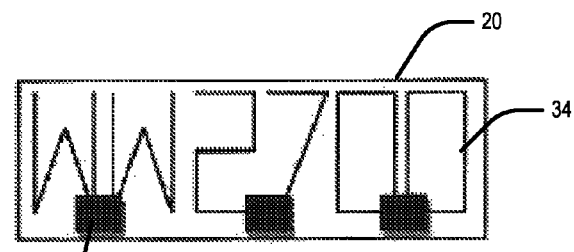

FIGS. 7A and 7B are top views of light emitting device diode regions according to various embodiments. As shown therein, the current spreading fingers 34 may be arranged to form geometric structures having pointed vertices, such as diamond shapes, triangles, etc.

Referring to FIGS. 7A and 7B, the current spreading fingers 34 may be arranged to form alphanumeric characters that communicate information. In particular, the current spreading fingers 34 may be arranged to form alphanumeric characters that communicate information relating to an operating property of the light emitting diode, such as information relating to the manufacturer, color temperature, wavelength, and/or luminous intensity of light emitted by the light emitting diode. For example, the LED current spreading fingers 34 shown in FIG. 7A are patterned to spell out the name "CREE", while the current spreading fingers 34 shown in FIG. 7B are patterned to spell out the letters "WW2700", which may indicate that the LED chip 10 is configured to generate warm white light having a color temperature of 2700 K.

Figure 8A:
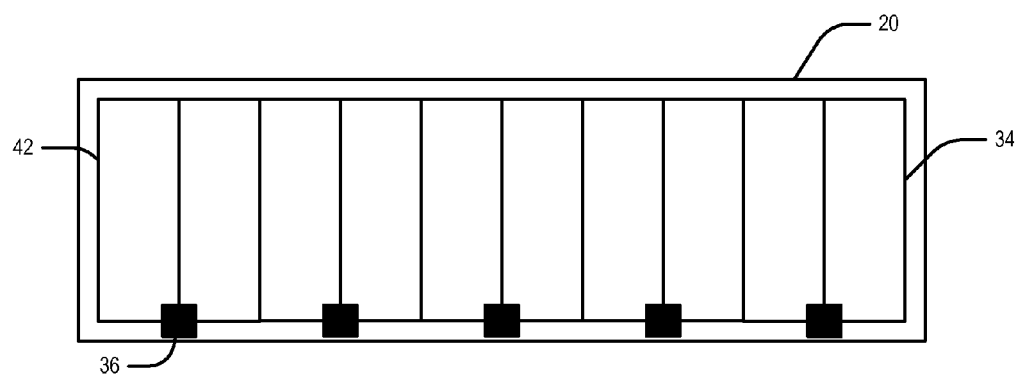
FIGS. 8A and 8B are top views of light emitting device diode regions according to various embodiments.
Figure 8B:
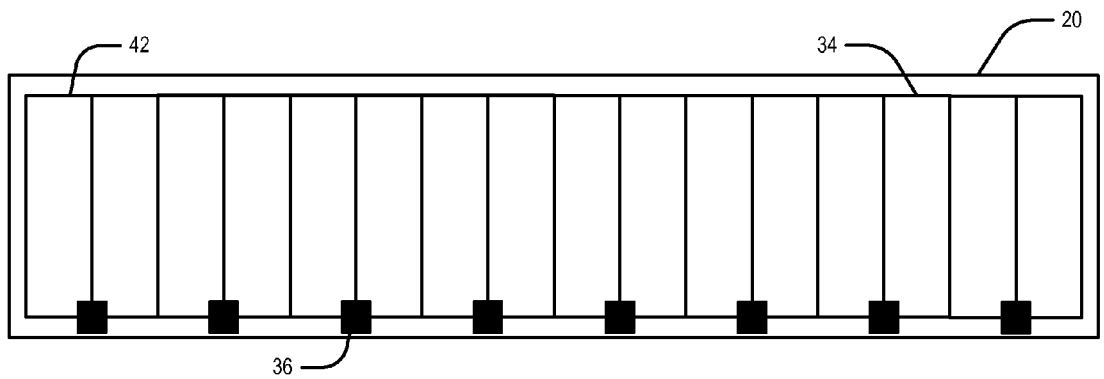

FIGS. 8A and 8B are top views of light emitting device diode regions according to various embodiments. FIGS. 8A and 8B illustrate the flexibility and/or scalability of some embodiments, in that a large number of current spreading bond pad unit cells 42 may be formed on a diode region 20. For example, in the embodiments shown in FIG. 8A, five current spreading bond pad unit cells 42 may be formed on a high aspect ratio diode region 20, while in FIG. 8B, eight current spreading bond pad unit cells 42 may be formed on a diode region 20 having an even higher aspect ratio. Thus, eight or more current spreading bond pad unit cells 42 may be used.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device comprising:
   a diode region comprising a first face and opposing edges; and
   a bond pad structure comprising at least three bond pads along only one of the opposing edges of the first face without bond pads on any other opposing edges, wherein each of the at least three bond pads of the bond pad structure forms an ohmic contact with a common, electrically continuous n- or p-layer of the diode region,
   wherein the bond pad structure comprises current spreading fingers extending from the at least three bond pads, and at least two bond pad unit cells arranged in a row along the first face of the diode region, each bond pad unit cell comprising a bond pad and at least two of the current spreading fingers, and each of the bond pad unit cells comprises a different pattern of current spreading fingers.

2. The light emitting device of claim 1, wherein at least one of the plurality of bond pad unit cells comprises a pattern of current spreading fingers that represents information.

3. The light emitting device of claim 2, wherein the pattern of current spreading fingers that represents information is arranged to form alphanumeric characters and the current spreading fingers comprise metal.

4. The light emitting device of claim 3, wherein the pattern of current spreading fingers is arranged to form alphanumeric characters that communicate information relating to an operating property of the light emitting diode.

5. The light emitting device of claim 3, wherein the pattern of current spreading fingers are arranged to form alphanumeric characters that communicate information relating to the color temperature, wavelength, and/or luminous intensity of light emitted by the light emitting diode.

6. The light emitting device of claim 1, wherein each of the bond pads is configured to receive a wire bond structure.

7. The light emitting device of claim 1, wherein the diode region comprises a second face opposite the first face, and the opposing edges comprise first and second opposing edges running along a width of the first face of the diode region, and the first face further comprises third and fourth opposing edges running along a length of the first face of the diode region, wherein the at least three bond pads are spaced apart along the first face from the third edge to the fourth edge of the first face and offset towards the first edge of the first face of the diode region.

8. The light emitting device of claim 7, wherein a ratio of the width of the first face to the length of the first face is greater than one.

9. The light emitting device of claim 7, wherein the current spreading bond pad structure comprises at least five bond pads spaced apart along the first face from the third edge to the fourth edge of the first face.

10. The light emitting device of claim 7, wherein the current spreading bond pad structure comprises at least eight bond pads spaced apart along the first face from the third edge to the fourth edge of the first face.

11. The light emitting device of claim 1, wherein the current spreading fingers are curved.

12. A light emitting device comprising:
   a semiconductor region comprising a first face; and
   a contact pattern arranged on the first face to convey information, wherein the contact pattern comprises metal that forms current spreading fingers, at least some of the current spreading fingers being electrically interconnected to others of the current spreading fingers and being arranged to form alphanumeric characters, wherein the alphanumeric characters of the contact pattern form an ohmic contact with a common, electrically continuous layer of the semiconductor region, wherein the bond pad structure comprises at least two bond pad unit cells arranged in a row along the first face of the semiconductor region, each bond pad unit cell comprising a bond pad and at least two of the current spreading fingers, and each of the bond pad unit cells comprises a different pattern of current spreading fingers, each of the different patterns of current spreading fingers forming the alphanumeric characters.

13. The light emitting device of claim 12, wherein the alphanumeric characters form communicate information relating to an operating property of the light emitting device.

14. The light emitting device of claim 12, wherein the alphanumeric characters form communicate information relating to the color temperature, wavelength, and/or luminous intensity of light emitted by the light emitting device.

15. The light emitting device of claim 12, wherein the current spreading fingers are curved.

16. A light emitting device comprising:
a diode region comprising a first face and opposing edges and a second face opposite the first face, and the opposing edges comprise first and second opposing edges running along a width of the first face of the diode region, and the first face further comprises third and fourth opposing edges running along a length of the first face of the diode region; and
a bond pad structure comprising at least four bond pads along only one of the opposing edges of the first face without bond pads on any other opposing edges, wherein the at least four bond pads are spaced apart along the first face from the third edge to the fourth edge of the first face and offset towards the first edge of the first face of the diode region, and wherein the bond pad structure further comprises current spreading fingers extending from the at least four bond pads onto the diode region and a ratio of the width of the first face to the length of the first face is greater than one, wherein the at least four bond pads of the bond pad structure form an ohmic contact with a common, electrically continuous n- or p-layer of the diode region, wherein the bond pad structure comprises at least two bond pad unit cells arranged in a row along the first face of the diode region, each bond pad unit cell comprising one of the at least four bond pads and at least two of the current spreading fingers, and each of the bond pad unit cells comprises a different pattern of current spreading fingers.

17. The light emitting device of claim 1, wherein a length of the diode region is greater than a width of the diode region, and the at least three bond pads are along the length of the diode region.

18. The light emitting device of claim 1, wherein the bond pad structure forms an ohmic contact with a cathode or anode of the diode region.

19. The light emitting device of claim 8, wherein the at least three bond pads comprise a single row along the first face from the third edge to the fourth edge.

20. The light emitting device of claim 16, wherein the at least four bond pads comprise a single row along the first face from the third edge to the fourth edge.

21. The light emitting device of claim 1, wherein the at least three bond pads are electrically continuous.

22. The light emitting device of claim 16, wherein the at least four bond pads are electrically continuous.

* * * * *